(12) United States Patent
Suh

(10) Patent No.: US 10,656,770 B2
(45) Date of Patent: May 19, 2020

(54) DISPLAY DEVICE WITH A PARTITION MEMBER

(71) Applicant: SAMSUNG DISPLAY CO., LTD., Yongin-si, Gyeonggi-do (KR)

(72) Inventor: Yeongsang Suh, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/391,091

(22) Filed: Apr. 22, 2019

(65) Prior Publication Data

US 2019/0250739 A1    Aug. 15, 2019

Related U.S. Application Data

(63) Continuation of application No. 15/051,592, filed on Feb. 23, 2016, now Pat. No. 10,268,325.

(30) Foreign Application Priority Data

Jun. 10, 2015    (KR) .................. 10-2015-0082144

(51) Int. Cl.
*G06F 3/041*    (2006.01)
*G06F 3/044*    (2006.01)
(Continued)

(52) U.S. Cl.
CPC ............ *G06F 3/044* (2013.01); *G06F 3/0412* (2013.01); *H01L 27/323* (2013.01); *H01L 27/3276* (2013.01); *H01L 51/529* (2013.01)

(58) Field of Classification Search
None
See application file for complete search history.

(56) References Cited

U.S. PATENT DOCUMENTS 6,689,492 B1    2/2004    Yamazaki et al.
6,970,219 B1 *  11/2005   Hermann ............ G02F 1/13452
                                                              349/1
(Continued)

FOREIGN PATENT DOCUMENTS

JP    2007-226068 A    9/2007
KR    92-6755 U        4/1992
(Continued)

OTHER PUBLICATIONS

English Abstract for Korean Patent No. 92/6755 U, Apr. 22, 1992, 2 Pages.
(Continued)

*Primary Examiner* — Kent W Chang
*Assistant Examiner* — Benjamin Morales
(74) *Attorney, Agent, or Firm* — Lewis Roca Rothgerber Christie LLP

(57) ABSTRACT

A display device includes a display panel including a plurality of pixels, the display panel having a display area with the pixels thereon and a peripheral area adjacent to the display area on a plane, a driving circuit part at the peripheral area and configured to provide an electrical signal to each of the pixels, a main circuit part at the peripheral area, the main circuit part having at least one portion that is spaced apart from the driving circuit part on a plane, the main circuit part being configured to provide a driving signal to the driving circuit part and the display panel, and a first partition member at a space between the main circuit part and the driving circuit part.

15 Claims, 15 Drawing Sheets

(51) Int. Cl.
*H01L 27/32* (2006.01)
*H01L 51/52* (2006.01)

(56) References Cited

U.S. PATENT DOCUMENTS

| | | | | |
|---|---|---|---|---|
| 8,563,970 | B2* | 10/2013 | Choi | H01L 51/52 |
| | | | | 257/40 |
| 9,351,349 | B2 | 5/2016 | Sakamoto | |
| 2004/0238827 | A1 | 12/2004 | Takayama et al. | |
| 2011/0193478 | A1 | 8/2011 | Kim | |
| 2014/0103315 | A1* | 4/2014 | Jung | H01L 27/3276 |
| | | | | 257/40 |
| 2014/0125902 | A1 | 5/2014 | Lee et al. | |
| 2014/0131693 | A1* | 5/2014 | Masumoto | G09F 9/00 |
| | | | | 257/40 |
| 2014/0300270 | A1* | 10/2014 | Sakamoto | H05B 33/10 |
| | | | | 315/51 |
| 2015/0001497 | A1* | 1/2015 | Jung | H01L 51/5253 |
| | | | | 257/40 |
| 2015/0041795 | A1* | 2/2015 | Suzuki | H01L 51/5016 |
| | | | | 257/40 |
| 2015/0163939 | A1* | 6/2015 | Park | G02F 1/13452 |
| | | | | 361/749 |
| 2015/0185960 | A1* | 7/2015 | Kim | G06F 3/0412 |
| | | | | 345/175 |
| 2016/0315284 | A1* | 10/2016 | Jeon | H01L 51/5256 |
| 2017/0148702 | A1* | 5/2017 | Funayama | G02F 1/13452 |

FOREIGN PATENT DOCUMENTS

| | | |
|---|---|---|
| KR | 10-2007-0000765 A | 1/2007 |
| KR | 10-2012-0042148 A | 5/2012 |

OTHER PUBLICATIONS

Robert Kultzow, "High thermally conductive epoxy system for electrical and electronic thermal management," Electrical Insulation Conference and Electrical Manufacturing & Coil Winding Conference, 2001. Proceedings, pp. 285-289.

* cited by examiner

DISPLAY DEVICE WITH A PARTITION MEMBER

CROSS-REFERENCE TO RELATED APPLICATION

This application is a continuation of U.S. patent application Ser. No. 15/051,592, filed Feb. 23, 2016, which claims priority to and the benefit of Korean Patent Application No. 10-2015-0082144, filed Jun. 10, 2015, the entire content of both of which is incorporated herein by reference.

BACKGROUND

1. Field

The present disclosure herein relates to a display device, and more particularly, to a display device having improved reliability in the manufacturing process thereof.

2. Description of the Related Art

Display devices include driving circuits that provide driving signals for driving the display devices. A driving circuit may generate various driving signals that drive various units constituting a display device.

For example, a driving circuit drives a display panel that displays an image, or drives a touch panel that detects an external touch. A driving circuit includes various driving elements, and may be directly mounted on the corresponding panel, or may be provided with a separate substrate and connected to the corresponding panel through a bonding process.

A process for connecting the driving circuit to the corresponding panel may be performed in various suitable ways. Here, light or heat may be applied to the corresponding panel, or pressure may be applied to the corresponding panel.

SUMMARY

The present disclosure provides a display device having improved reliability by preventing other elements (or components) from being damaged due to a process for connecting a driving circuit.

An embodiment of the inventive concept provides a display device including a display panel including a plurality of pixels, the display panel having a display area with the pixels thereon and a peripheral area adjacent to the display area on a plane, a driving circuit part at the peripheral area and for providing an electrical signal to each of the pixels, a main circuit part at the peripheral area, the main circuit part having at least one portion that is spaced apart from the driving circuit part on a plane, the main circuit part providing a driving signal to the driving circuit part and the display panel, and a first partition member at a space between the main circuit part and the driving circuit part.

In an embodiment, the first partition member may extend along a side surface of the driving circuit part which faces the main circuit part.

In an embodiment, the first partition member may surround at least two side surfaces of the driving circuit part or at least two side surfaces of the main circuit part.

In an embodiment, the display device may further include a first adhesion member between the main circuit part and the display panel to attach the main circuit part to the display panel, wherein the first adhesion member may be formed of a heat or light reactive material.

In an embodiment, the display device may further include a second adhesion member disposed between the driving circuit part and the display panel to attach the driving circuit part to the display panel, wherein the second adhesion member may be formed of a heat or light reactive material.

In an embodiment, the driving circuit part may include an integrated circuit.

In an embodiment, the display panel may further include at least one conductive line having one end that is connected to the driving circuit part and another end at a pad part, and the main circuit part may be connected to the pad part, and the first partition member may overlap the at least one conductive line.

In an embodiment, the first partition member may be formed of a material having thermal conductivity of about 4 W/m·K or less.

In an embodiment, the first partition member may be formed of polymer.

In an embodiment, the first partition member may include an insulation part on and contacting the at least one conductive line and electrically insulated from the conductive line, and a blocking part on the insulation part, the blocking part being formed of a material having thermal conductivity of about 100 W/m·K or less.

In an embodiment, the blocking part may be formed of a metal.

In an embodiment, each of the pixels may include at least one thin film transistor, and at least one display element connected to the at least one thin film transistor, wherein the display panel may include an array substrate including the at least one thin film transistor, a display part on the array substrate and including the at least one display element, and an encapsulating part on the display part to encapsulate the display part.

In an embodiment, the display device may further include a touch part on the encapsulating part, the touch part including a plurality of conductive patterns each of which is configured to receive an external touch signal, and an optical member on the touch part.

In an embodiment, the display device may further include a touch driving circuit part spaced apart from the optical member on a plane and coupled to the touch part, the touch driving circuit part providing a driving signal to the conductive pattern, and a second partition member in a space between the touch driving circuit part and the optical member.

In an embodiment, the display device may further include a third adhesion member between the touch driving circuit part and the touch part, wherein the third adhesion member may be formed of a heat or light reactive material.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
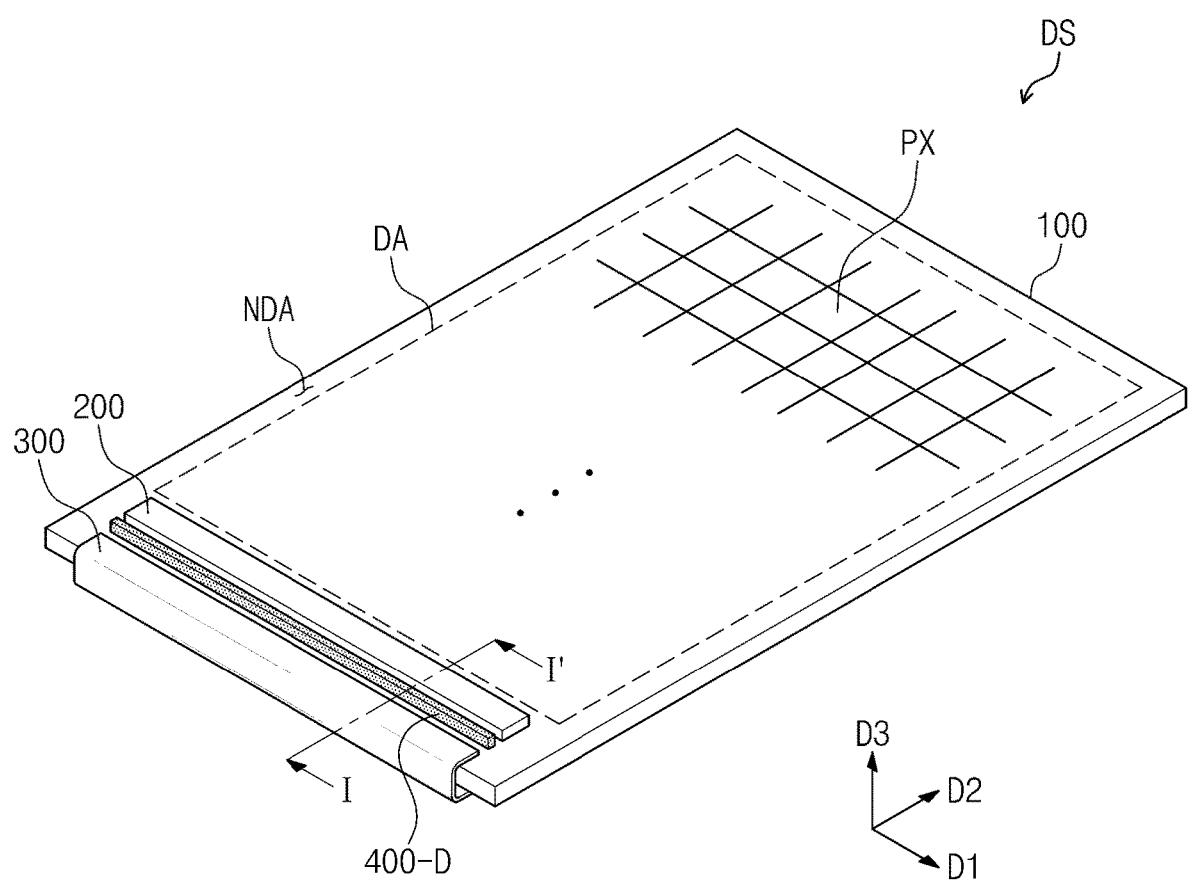
FIG. 1 is a perspective view of a display device according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will be understood that, although the terms "first", "second", "third", etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer, or section discussed below could be termed a second element, component, region, layer, or section, without departing from the spirit and scope of the present invention.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Further "connection," "connected," etc. may also refer to "electrical connection," "electrically connect," etc. depending on the context in which they are used as those skilled in the art would appreciate. When an element or layer is referred to as being "directly on," "directly connected to," "directly coupled to," "directly connected with," "directly coupled with," or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Hereinafter, exemplary embodiments of the inventive concept will be described in detail with reference to the accompanying drawings.

Figure 2:
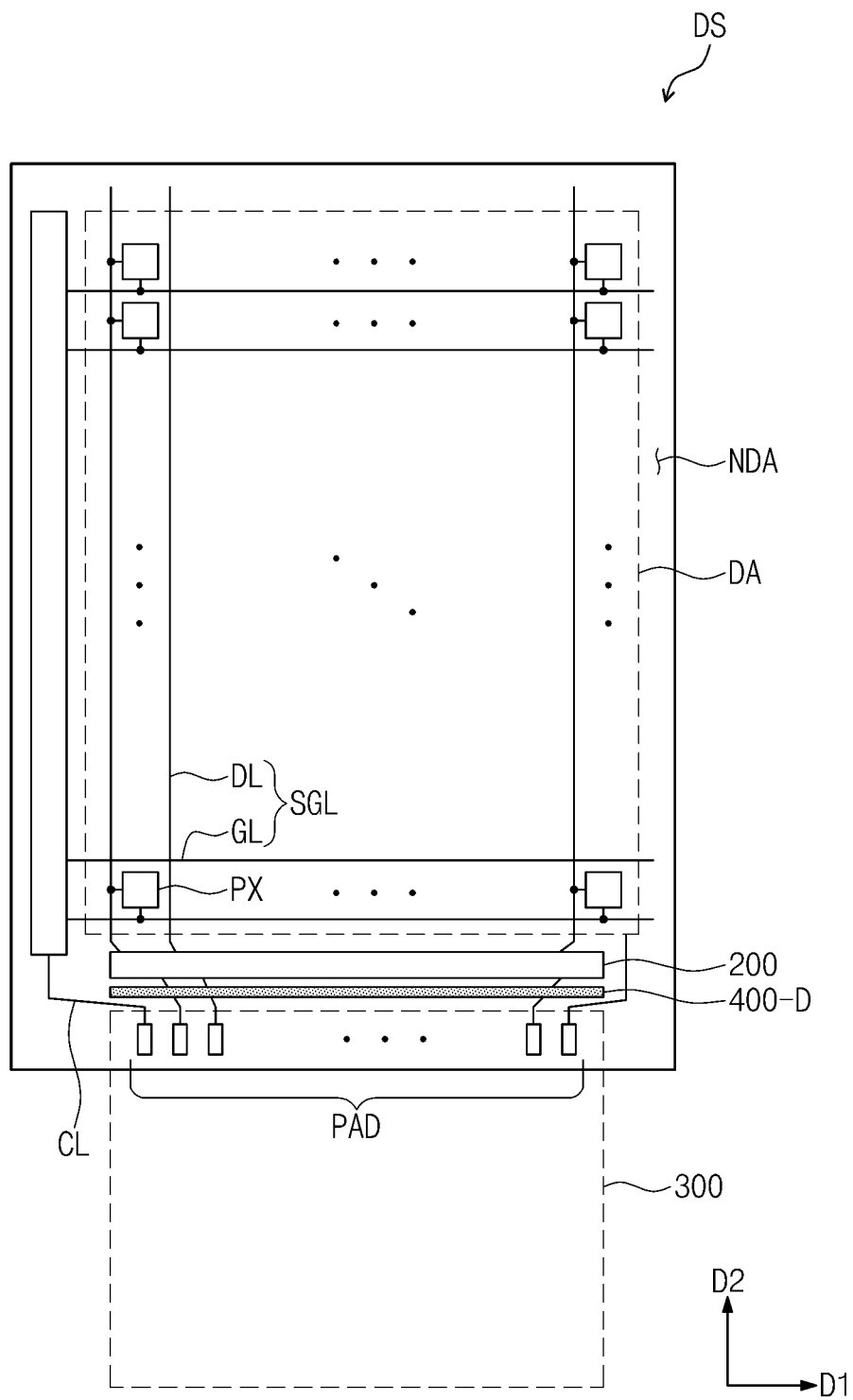
FIG. 2 is a plan view of the display device of FIG. 1.

FIG. 1 is a perspective view of a display device according to an embodiment of the inventive concept, and FIG. 2 is a plan view of the display device of FIG. 1.

A display device DS includes a display panel 100, a driving circuit part 200, a main circuit part 300, and a first partition wall 400-D (hereinafter, referred to as a "partition member"). The display panel 100 may be divided into a display area DA and a peripheral area NDA adjacent the display area DA.

The display panel 100 includes a plurality of pixels PX on the display area DA, and includes a plurality of signal lines SGL respectively connected to the pixels PX. The signal lines SGL include a plurality of gate lines GL extending in a first direction D1 and arranged in a second direction D2, and include a plurality of data lines DL extending in the second direction D2 and arranged in the first direction D1. Each of the gate lines GL and each of the date lines DL are insulated from each other to cross each other.

The pixels PX are arranged in a matrix shape defined by the first and second directions D1 and D2. Each of the pixels PX is connected to a corresponding gate line of the gate lines GL, and to a corresponding data line of the data lines DL. The pixels PX may receive electrical signals from the corresponding gate line of the gate lines GL and the corresponding data line of the data lines DL to generate an image.

Each of the pixels PX includes at least one thin film transistor TFT and a display element. The display panel 100 may include various suitable display elements. For example, the display element may be a liquid crystal capacitor, an organic light emitting element, an electrophoretic element, or an electrowetting element. In the current embodiment, for example, the display panel 100 is an organic light emitting display panel including an organic light emitting diode (OLED).

The driving circuit part 200 is connected to at least one of the signal lines SGL. The driving circuit part 200 provides an electrical signal to each of the pixels PX through the signal lines SGL connected thereto.

The driving circuit part 200 may be a data driving circuit connected to the data lines DL to provide a data signal to each of the data lines DL. Here, a gate driving circuit connected to the gate lines GL may be separately provided. The gate driving circuit is connected to the gate lines GL to successively provide a gate signal to the gate lines GL. The gate driving circuit may be mounted on the display panel 100 in a chip on glass (COG) manner. In another exemplary embodiment, the display device may include a gate driving circuit that is separately provided and bonded to the display panel 100.

The driving circuit part 200 may include the gate driving circuit and the data driving circuit to control all of the signal lines SGL by itself. In this case, the display area DA may be expended to an area at which the gate driving circuit of FIG. 2 is located to secure a wider display area DA, and a narrow bezel may be realized. The driving circuit part 200 may be provided in various suitable types, and is not limited to one particular embodiment.

The driving circuit part 200 may be a chip-type integrated circuit. The driving circuit part 200 may be provided with a COG type circuit directly mounted on a base substrate BS. Because the driving circuit part 200 is separately provided and mounted on the display panel, defects due to an integrated process may be prevented, and process costs may be reduced.

Lines extending from the driving circuit part 200, the gate driving circuit, and the display area DA extend to an end of the display panel 100. A pad part PAD is defined on each of the ends of the lines. In FIG. 2, the main circuit part 300 is illustrated by using a dotted line to easily express the pad part PAD.

The main circuit part 300 and the driving circuit part 200 are spaced apart from each other in the second direction D2 with a space (e.g., a predetermined space) therebetween. Elements (or components) and lines for connecting the elements (or components) to each other are mounted on the main circuit part 300. The main circuit part 300 may generate a driving voltage through the mounted elements.

At least one portion of the main circuit part 300 overlaps the pad part PAD. The main circuit part 300 is coupled to the display panel 100 through the pad part PAD. The main circuit part 300 is electrically connected to the pad part PAD to provide the driving voltage to the driving circuit part 200 and the pixels PX.

The partition member 400-D is at the peripheral area NDA. The partition member 400-D is at an area at which the main circuit part 300 is spaced from the driving circuit part 200. Thus, the driving circuit part 200 and the main circuit part 300 may be spaced from each other with the partition member 400-D therebetween.

The partition member 400-D may have various suitable shapes and is not limited to one particular embodiment. For example, as illustrated in FIG. 1, the partition member 400-D may have a line shape extending in the first direction D1. The partition member 400-D may have a length along the first direction D1, which corresponds to the length of the driving circuit part 200 along the first direction D1.

Figure 3A:
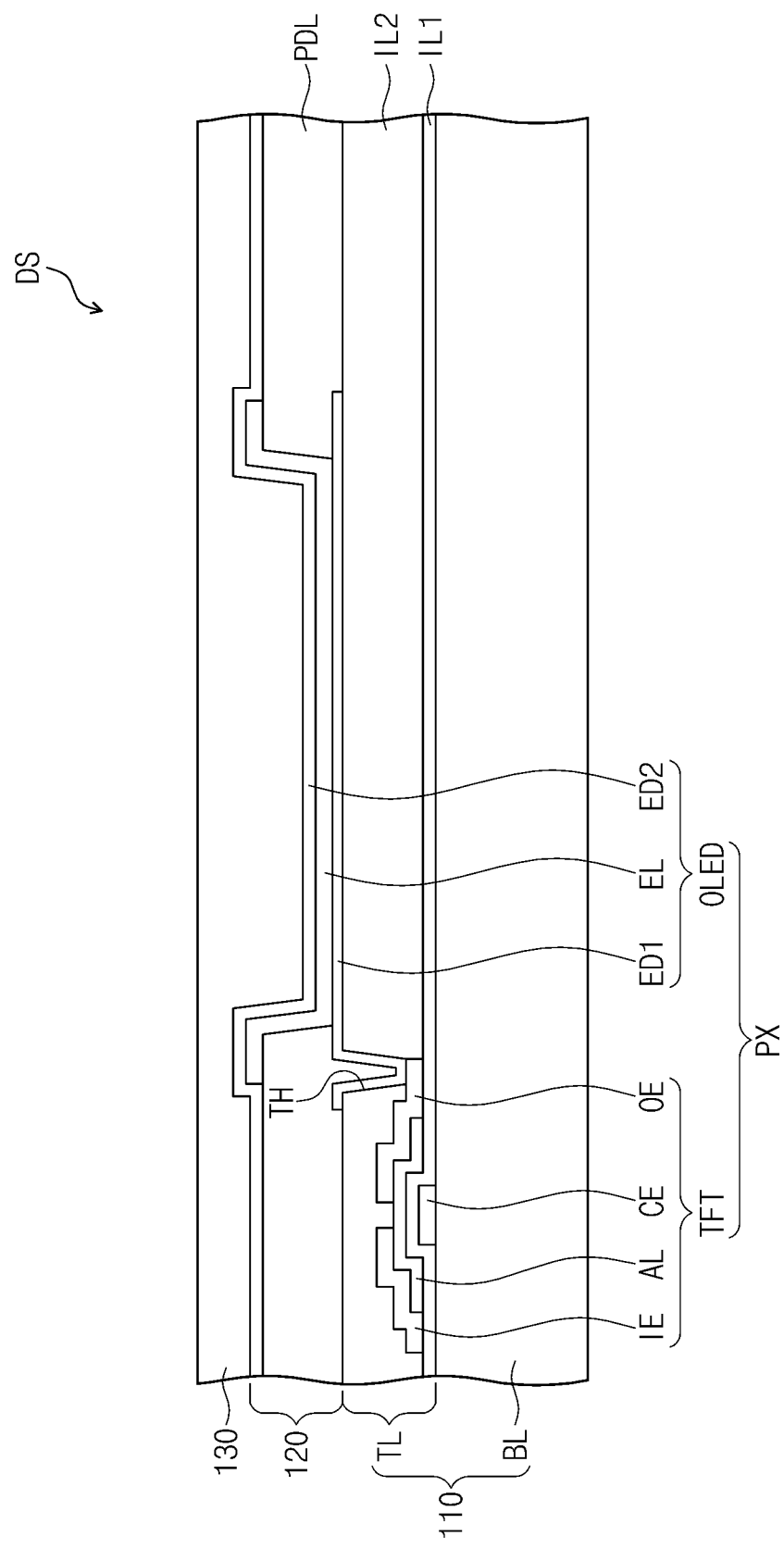
FIG. 3A is a partial sectional view illustrating a portion of the display device according to the embodiment of the inventive concept.
Figure 3B:
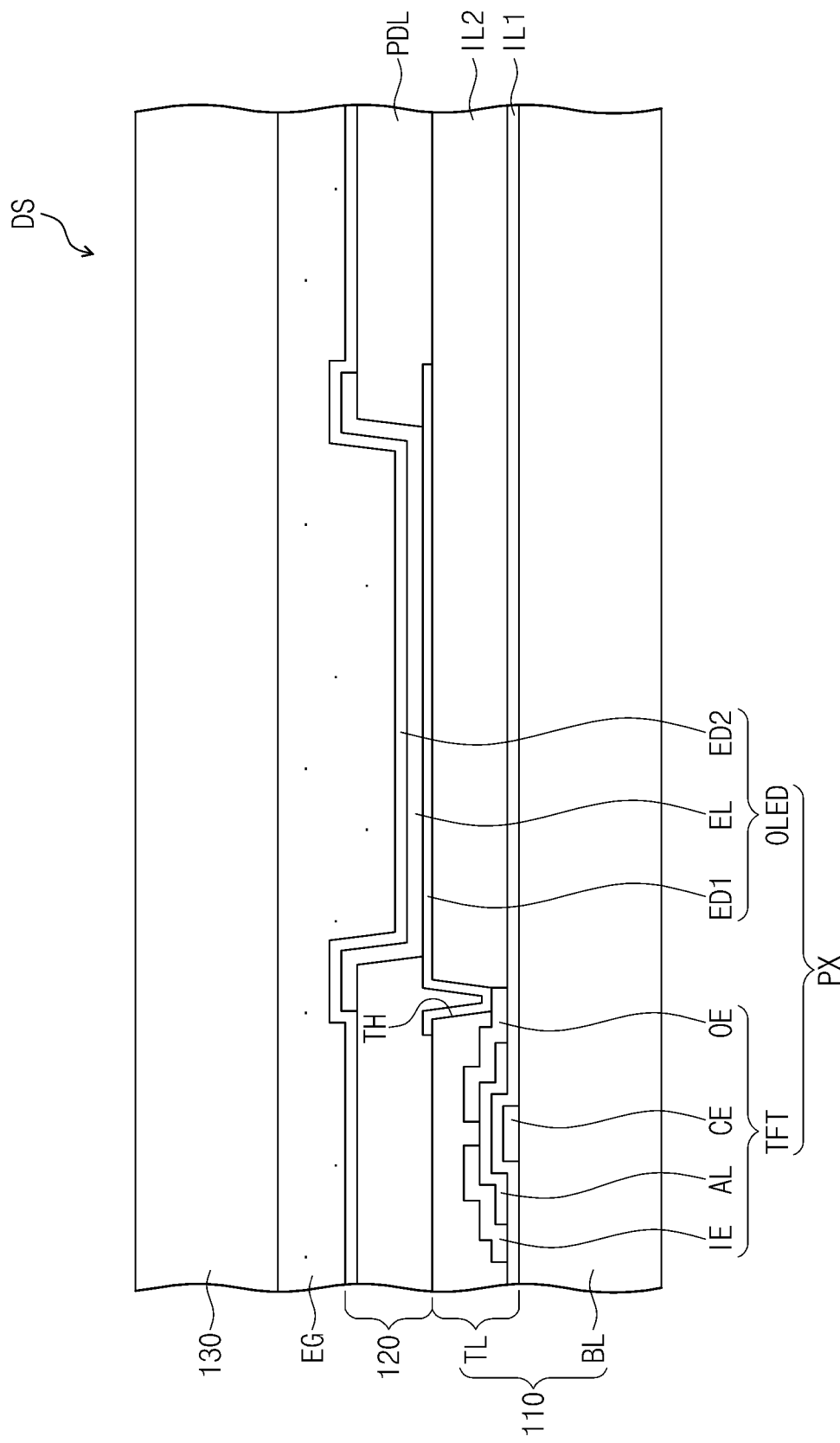
FIG. 3B is a partial sectional view illustrating a portion of the display device according to the embodiment of the inventive concept.
Figure 4:
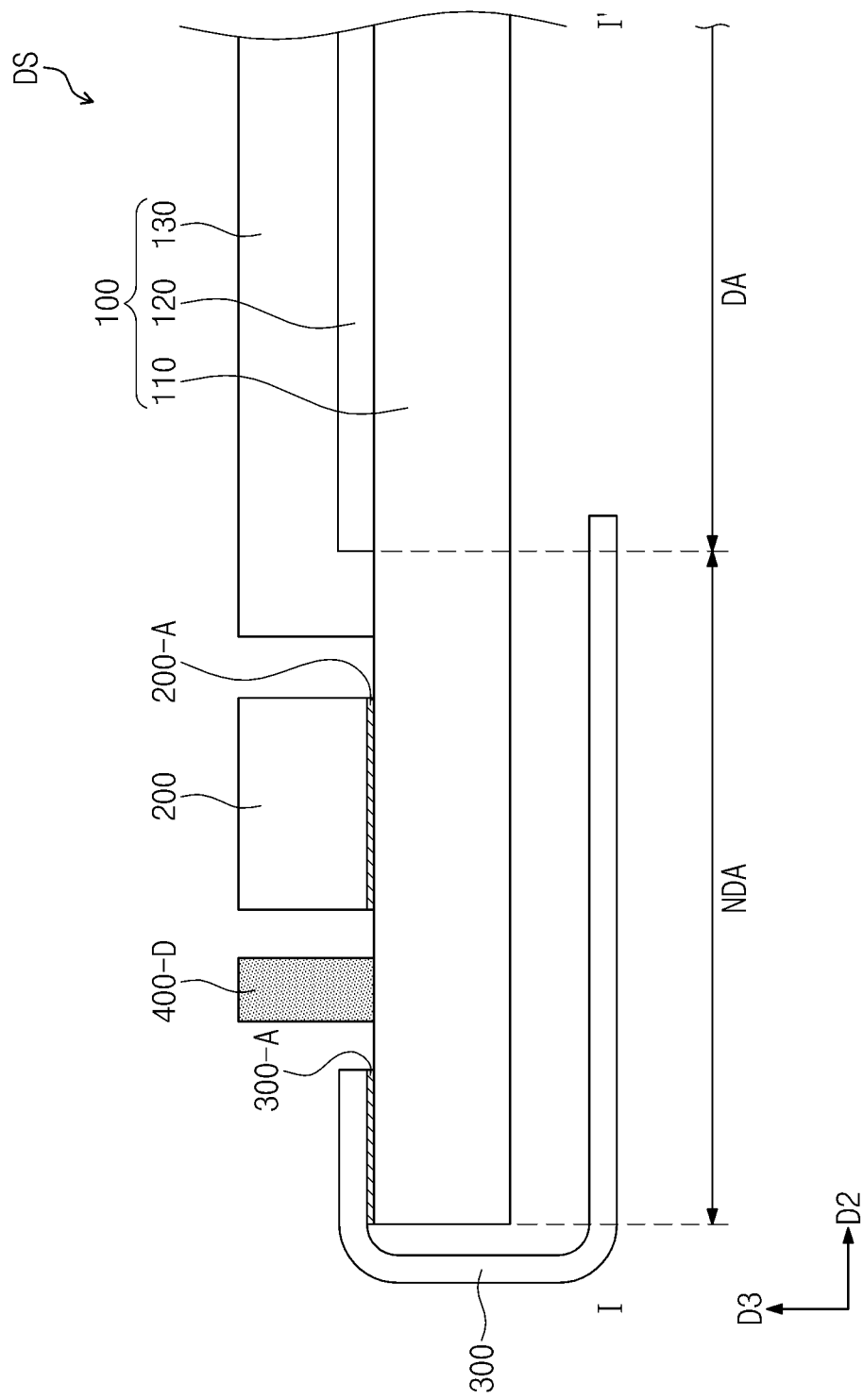
FIG. 4 is a cross-sectional view taken along the line I-I' of FIG. 1.

FIG. 3A is a partial sectional view illustrating a portion of the display device according to the embodiment of the inventive concept, FIG. 3B is a partial sectional view illustrating a portion of the display device according to the embodiment of the inventive concept, and FIG. 4 is a cross-sectional view taken along the line I-I' of FIG. 1.

In FIGS. 3A and 3B, an area of a location of one pixel PX of the display area (see reference symbol DA of FIG. 1) is illustrated. In FIG. 4, the peripheral area NDA is illustrated. Hereinafter, the display device DS will be described in more detail with reference to FIGS. 3A to 4.

As illustrated in FIGS. 3A and 3B, the display panel 100 includes an array substrate 110, a display part 120, and an encapsulating part 130. The array substrate 110 includes a base layer BL and a thin film element layer TL.

The base layer BL may be formed of an insulation material. For example, the base layer BL may be a glass substrate, a plastic substrate, or an insulation film.

The thin film element layer TL may include the thin film transistor TFT and a plurality of insulation films IL1 and IL2. The thin film transistor TFT includes a control electrode CE, a semiconductor layer AL, an input electrode IE, and an output electrode OE.

The control electrode CE is located on the base layer BL. The gate lines (see reference symbol GL of FIG. 2) may be at the same layer as the control electrode CE. The control electrode CE may be branched from a corresponding gate line of the gate lines GL.

The semiconductor layer AL is on the control electrode CE, and overlaps the control electrode CE. The semiconductor layer AL may be formed of a semiconductor material. For example, the semiconductor layer AL may include silicon or a metal oxide semiconductor.

The input electrode IE and the output electrode OE may be spaced apart from each other on the same layer. The data lines (see reference symbol DL of FIG. 2) are at the same layer on the input electrode IE and the output electrodes OE. One of the input electrode IE and the output electrode OE may be branched from a corresponding data line of the data lines DL.

Each of the input electrode IE and the output electrode OE partially overlaps the semiconductor layer AL. The semiconductor layer AL may further include an ohmic contact layer at an area at which the semiconductor layer AL overlaps each of the input electrodes IE and the output electrodes OE.

In the current embodiment, the input electrode IE and the output electrode OE are above the control electrode CE. In other embodiments, the input electrode IE and the output electrode OE may be under the control electrode CE with the semiconductor layer AL between the control electrode CE and the input and output electrodes IE and OE.

The insulation films IL1 and IL2 may include at least one of inorganic matter and organic matter. Also, each of the insulation films IL1 and IL2 may have a single-layered or multiple-layered structure.

The insulation films IL1 and IL2 includes a first insulation film IL1 and a second insulation film IL2. The first insulation film IL1 is between the control electrode CE and the semiconductor layer AL to insulate the control electrode CE from the semiconductor layer AL. Also, the first insulation film IL1 insulates the gate lines GL from the data lines DL.

The second insulation film IL2 is on the thin film transistor TFT. The second insulation film IL2 insulates the thin film transistor TFT from other components. The data lines DL may be covered by the second insulation film IL2, and may thus be insulated from other components.

The display part 120 is on the array substrate 110. The display part 120 includes a display element OLED (e.g., organic light emitting diode OLED) and a pixel defining film PDL. The display element OLED includes a first electrode ED1, an organic layer EL, and a second electrode ED2.

The first electrode ED1 may receive an electrical signal through the thin film transistor TFT. The first electrode ED1 passes through the second insulation film IL2, and is connected to the output electrode OE.

The first electrode ED1 may be a transmissive electrode, a semi-transmissive electrode, or a reflective electrode. Also, the first electrode ED1 may have a single-layered structure or a multiple-layered structure having a plurality of layers.

The pixel defining film PDL is on the second insulation layer IL2. The pixel defining film PDL may include at least one of the organic matter and the inorganic matter. The pixel defining film PDL may expose at least one portion of the first electrode ED1.

The organic layer EL is on the first electrode ED1. The organic layer EL may cover a portion of the first electrode ED1, which is exposed by the pixel defining film PDL. The organic layer EL may have a single-layered structure or a multiple-layered structure having a plurality of layers. When the organic layer EL has a multiple-layered structure, the organic light emitting diode (OLED) device may have improved light efficiency.

The organic layer EL includes a light emitting layer that generates light when the electrical signal is applied thereto. The light emitting layer is not particularly limited, and may be formed of a common material. For example, the light emitting layer may be formed of a material that emits light with at least one of red, green, and blue colors, and may include a fluorescent material or a phosphorescent material.

The second electrode ED2 is on the organic layer EL and the pixel defining film PDL. The second electrode ED2 may have an integrated shape for covering an entire surface of the display area DA. The second electrode ED2 may be a transmissive electrode, a semi-transmissive electrode, or a reflective electrode, and is not limited to one particular embodiment.

The encapsulating part 130 is on the display part 120, and may encapsulate the display element OLED to protect the display element OLED from moisture and oxygen. The encapsulating part 130 may be formed of a transparent insulation material. The encapsulating part 130 may include at least one of the organic matter and the inorganic matter. The encapsulating part 130 may be provided in various suitable types.

For example, as illustrated in FIG. 3A, the encapsulating part 130 may be a thin film encapsulating layer that is directly disposed on the display part 120. Here, the encapsulating part 130 may have a structure in which an organic film and/or an inorganic film are stacked on each other several times. The thin film encapsulating layer allows the display device DS to be slimmer.

Alternatively, as illustrated in FIG. 3B, the encapsulating part 130 may be a glass substrate. Here, a gap (e.g., a predetermined gap) may be defined between the encapsulating part 130 and the display part 120. The gap may be filled with an inert fluid EG. The encapsulating part 130 may be provided in various suitable types, and is not limited to one particular embodiment.

As illustrated in FIG. 4, the display area DA may be defined by the display part 120. As described above, the driving circuit part 200, the main circuit part 300, and the partition member 400-D are disposed at the peripheral area NDA.

At least one portion of each of the main circuit part 300 and the driving circuit part 200 is coupled to the array substrate 110. Here, at least one portion of the main circuit part 300 and the driving circuit part 200 may be bonded and coupled to the substrate 110 through adhesion members 300-A and 200-A (e.g., predetermined adhesion members 300-A and 200-A), respectively.

Each of the adhesion members 300-A and 200-A may be an anisotropic conductive film. The adhesion members 300-A and 200-A may fix (e.g., attach) the at least one portion of the main circuit part 300 and the driving circuit part 200 to the array substrate 110, and may connect the at least one portion of the main circuit part 300 and the driving circuit part 200 to the lines and the pads (see reference symbol PAD of FIG. 2) on the array substrate 110.

The partition member 400-D is at a space between the main circuit part 300 and the driving circuit part 200. The partition member 400-D may block an effect of heat, which is generated in a process for bonding the main circuit part 300 to the array substrate 110, from the driving circuit part 200.

The partition member 400-D may block various paths through which heat generated from the main circuit part 300 is transferred to the driving circuit part 200. For example, the partition member 400-D may block radiant heat transferred to the driving circuit part 200 through air.

The partition member 400-D may block, or occupy, the space defined between the driving circuit part 200 and the main circuit part 300. Thus, the partition member 400-D may block a path through which the radiant heat would otherwise directly reach the driving circuit part 200 from the main circuit part 300 through the air.

The partition member 400-D may be formed of various suitable materials. The partition member 400-D according to an embodiment of the inventive concept may be formed of a material having low thermal conductivity or a material having high thermal conductivity.

For example, the partition member 400-D may be formed of a material having thermal conductivity of about 4 W/m·K (watts per meter kelvin) or less. Here, the partition member 400-D may block the radiant heat that is directly transferred through the air. The radiant heat generated from the main circuit part 300 may be blocked by the partition member 400-D, and may thus not easily reach the driving circuit part 200.

The partition member 400-D may be formed of a material having high thermal conductivity. For example, the partition member 400-D may be formed of polymer or metal having high thermal conductivity.

The partition member 400-D may absorb the radiant heat to prevent or substantially prevent the radiant heat from reaching the driving circuit part 200. The heat absorbed from the partition member 400-D is dispersed to the outside through the air contacting the partition member 400-D, or may be dissipated as time elapses.

The partition member 400-D contacts the array substrate 110. Thus, the partition member 400-D may block conductive heat that is otherwise transferred to the driving circuit part 200 through the array substrate 110.

Here, the partition member 400-D may be formed of a material having higher thermal conductivity than that of the array substrate 110. The heat transferred to the array substrate 110 may be absorbed by the partition member 400-D, and may be dispersed to the surroundings before reaching the driving circuit part 200. Thus, the partition member 400-D may block a path through which conductive heat indirectly reaches the driving circuit part 200.

The partition member 400-D may have various suitable widths. As a width of the partition member 400-D increases, the partition member 400-D may gradually increase in a heat blocking effect. When the partition member 400-D is formed of a material having low thermal conductivity, the partition member 400-D may have a width in an extent that the partition member 400-D contacts at least one of the driving circuit part 200 and the main circuit part 300.

As a bezel area of the display device decreases, the peripheral area NDA may reduce in width. Thus, a distance between the driving circuit part 200 and the main circuit part 300 may be reduced.

The display device DS according to an embodiment of the inventive concept may further include the partition member 400-D to spatially block the driving circuit part 200 and the main circuit part 300, even though the distance between the driving circuit part 200 and the main circuit part 300 is reduced. Thus, even when the bezel area of the display device DS is reduced, the driving circuit part 200 may be stably installed, and thus reliability of the display device DS may improve.

Figure 5:
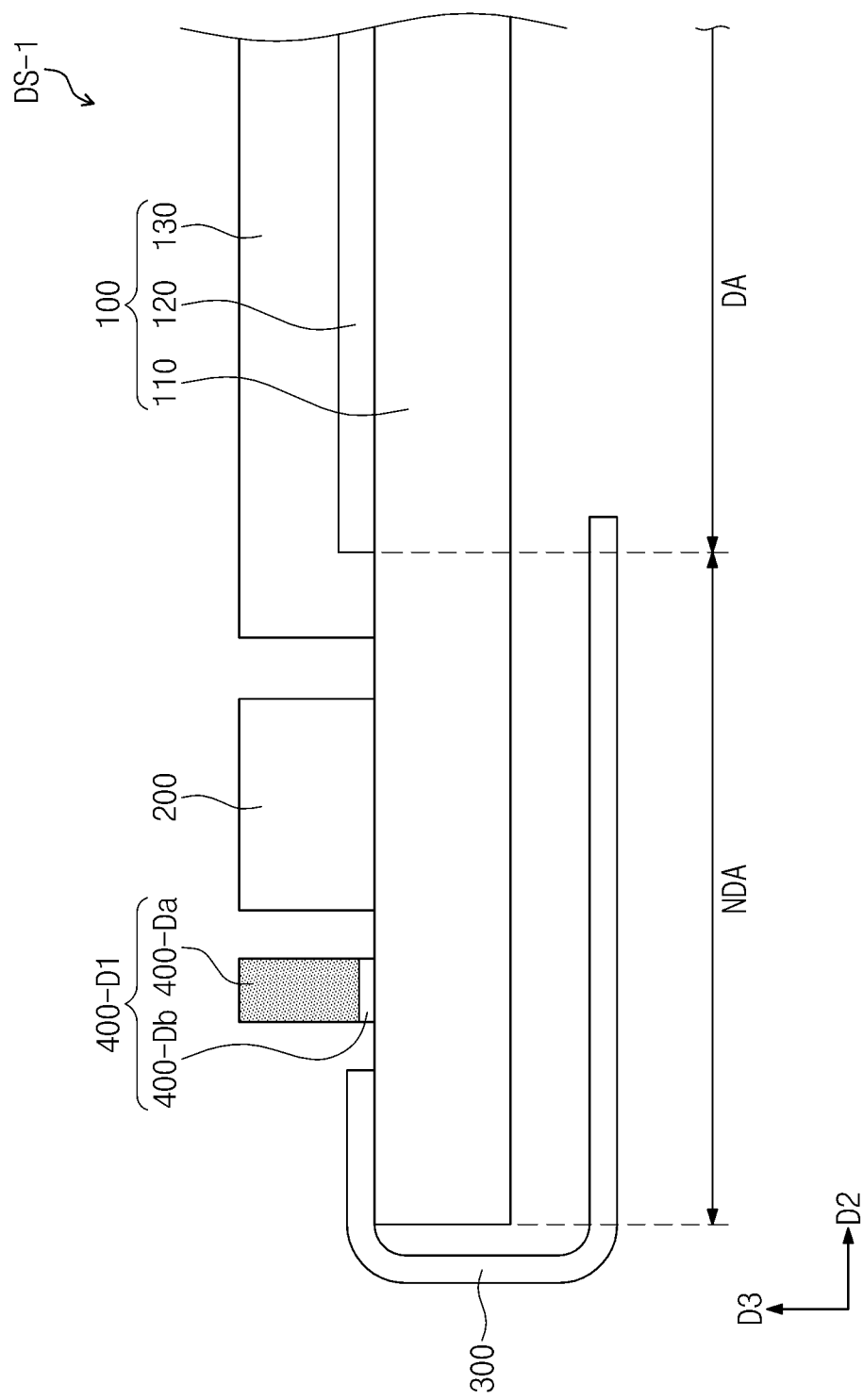
FIG. 5 is a partial sectional view of the display device according to an embodiment of the inventive concept.

FIG. 5 is a partial sectional view of the display device according to an embodiment of the inventive concept. In FIG. 5, an area corresponding to that of FIG. 4 is depicted. The same components as those of FIGS. 1 to 4 are represented with the same reference numerals and symbols, and repeated description may be omitted.

A partition member 400-D1 may include a blocking part 400-Da and an insulation part 400-Db. The blocking part 400-Da may correspond to the partition member 400-D of FIG. 4.

The insulation part 400-Db blocks direct contact between the array substrate 110 and the blocking part 400-Da. Thus, even though the partition member 400-D1 overlaps conductive lines CL on the array substrate 110 on a plane, the partition member 400-D1 may be electrically insulated from the conductive lines CL.

A material having high thermal conductivity tends to have high electrical conductivity. Because the partition member 400-D1 is disposed to overlap the conductive lines CL, the partition member 400-D1 and the conductive lines CL may easily electrically interfere with each other.

The partition member 400-D1 according to the inventive concept may further include the insulation part 400-Db to facilitate selection of a component for the blocking part 400-Da with consideration of only the thermal conductivity (e.g., without consideration of the electrical conductivity). Thus, the partition member 400-D1 may be formed of various materials.

For example, when the blocking part 400-Da is formed of a heat-radiative material having high thermal conductivity, the blocking part 400-Da may include metal having high electrical conductivity. For example, because each of aluminum, copper, or silver has relatively high thermal conductivity of about 100 W/m·K and also has high electrical conductivity, the conductive lines CL may be short-circuited.

The partition member 400-D1 according to the inventive concept may further include the insulation part 400-Db to electrically insulate the blocking part 400-Da from the conductive lines CL. Thus, the partition member 400-D1 may stably dissipate heat without affecting driving of the display panel 100 even though the partition member 400-D1 includes the metal.

Figure 6A:
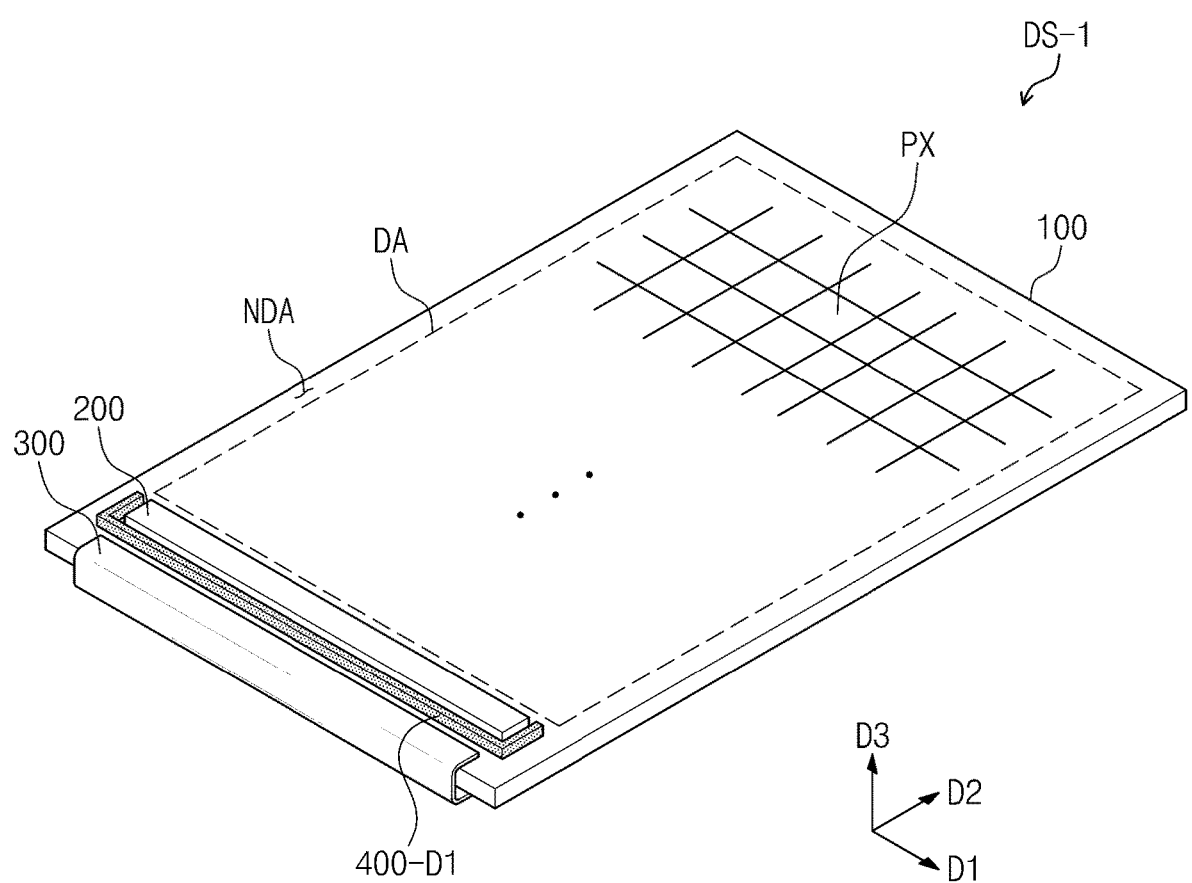
FIGS. 6A and 6B are perspective views of a display device according to an embodiment of the inventive concept.
Figure 6B:
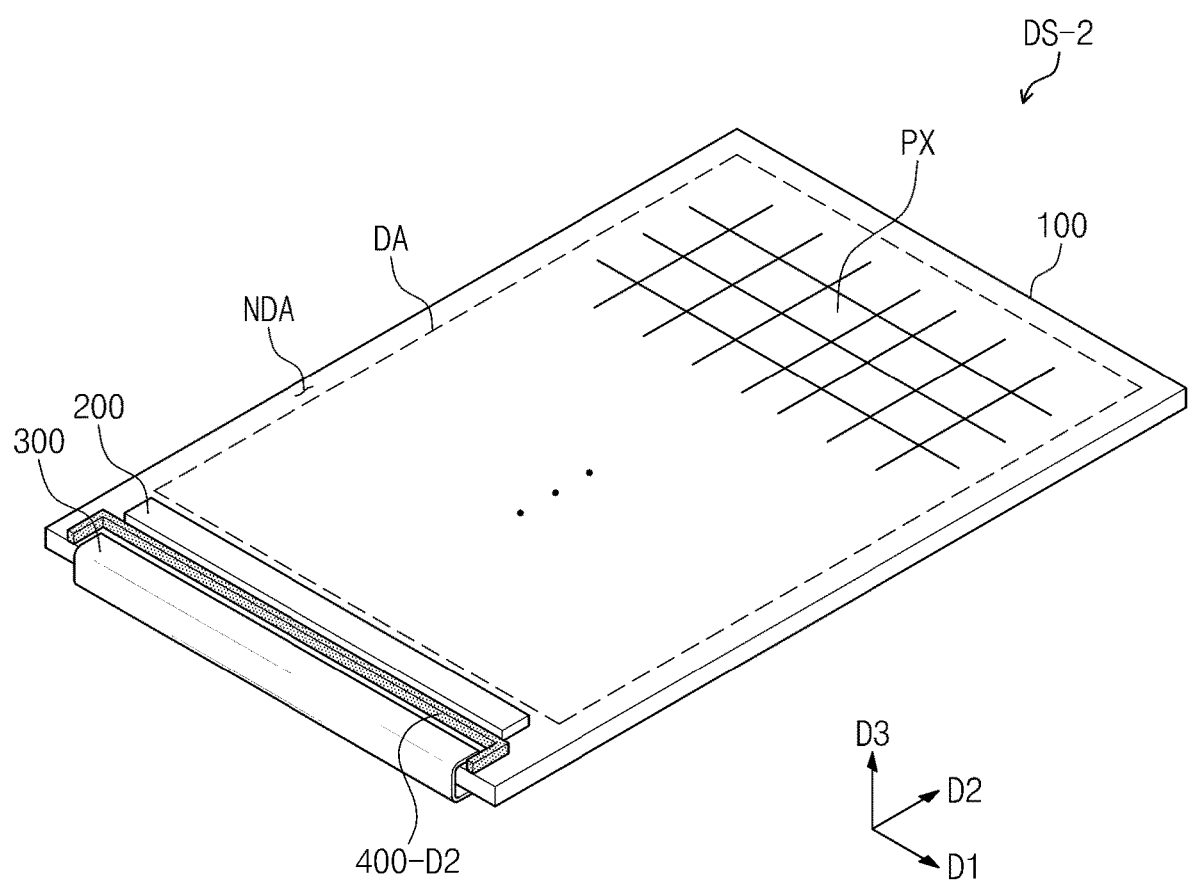

FIGS. 6A and 6B are perspective views of a display device according to an embodiment of the inventive concept. Display devices DS-1 and DS-2 of FIGS. 6A and 6B have substantially the same components as those of FIG. 1 except for shapes of the partition members 400-D1 and 400-D2. Thus, the same components as those of FIGS. 1 to 5 will be represented with the same reference numerals and symbols, and repeated description may be omitted.

The partition member 400-D according to the inventive concept may have a shape that surrounds at least two side surfaces of the driving circuit part 200. For example, as illustrated in FIG. 6A, the partition member 400-D1 surrounds three side surfaces of the driving circuit part 200. The partition member 400-D1 may prevent or substantially prevent the side surfaces of the driving circuit part 200 from being exposed to the main circuit part 300.

Alternatively, the partition member according to the inventive concept may have a shape that surrounds at least two side surfaces of the main circuit part 300. For example, as illustrated in FIG. 6B, the partition member 400-D2 surrounds three side surfaces of the main circuit part 300, which are coupled to the display panel 100.

The partition member 400-D2 may surround a periphery of the main circuit part 300 that is a heat source in a process for bonding the main circuit part 300, which will be described later, to effectively block dispersion of the heat generated from the main circuit part 300.

FIGS. 6A and 6B are exemplarily illustrated, and the partition member according to the inventive concept may have various suitable shapes. The partition member is not limited to any one shape, and the partition member may spatially block the heat generated from the main circuit part to protect the driving circuit part 200 and the display panel 100.

Figure 7:
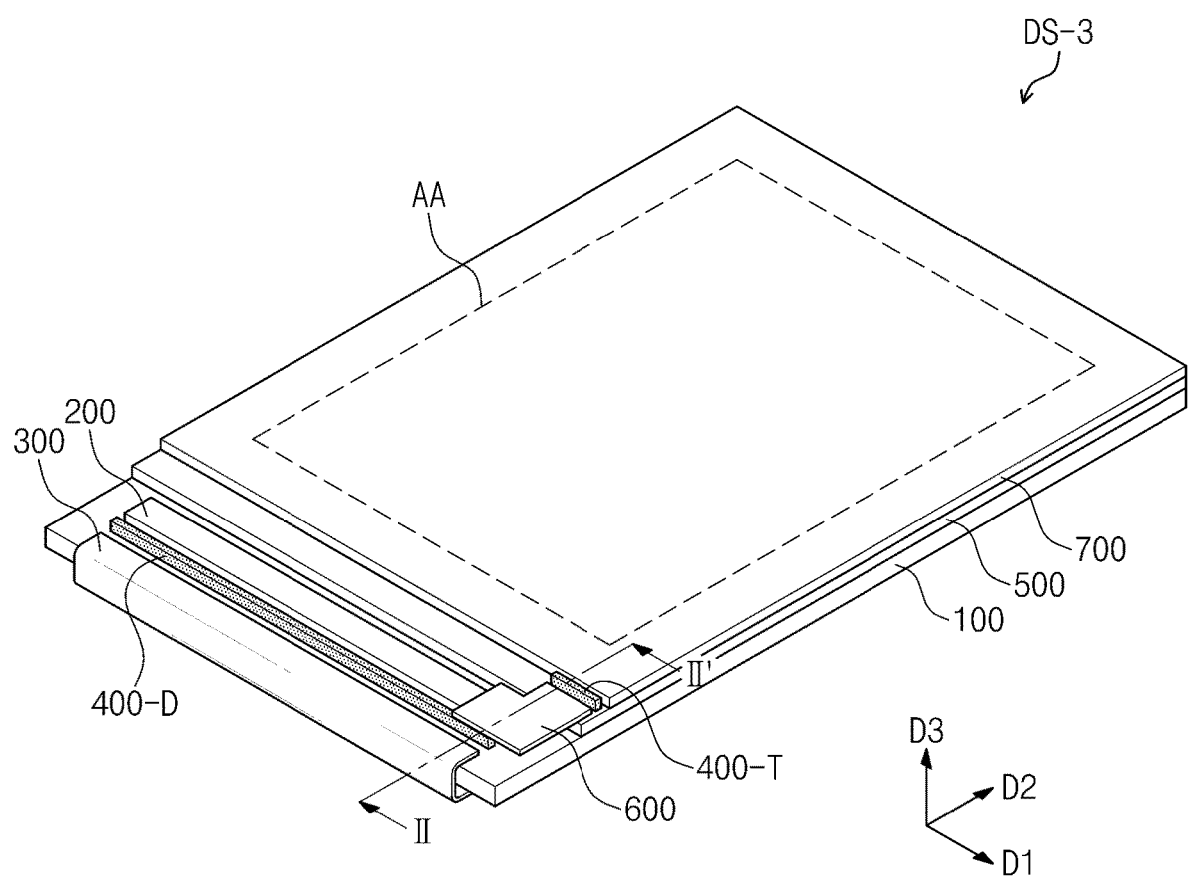
FIG. 7 is a perspective view of a display device according to an embodiment of the inventive concept.
Figure 8:
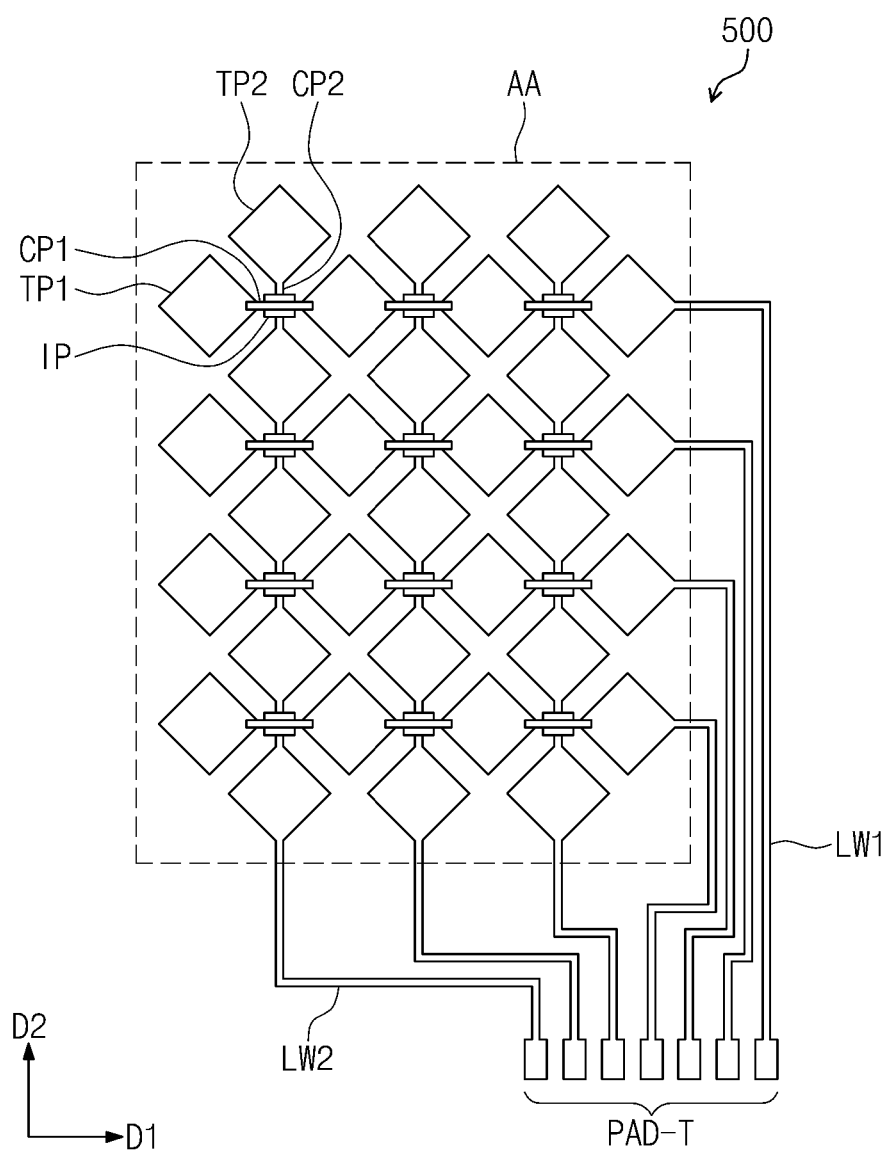
FIG. 8 is a plan view illustrating a portion of components in FIG. 7.
Figure 9:
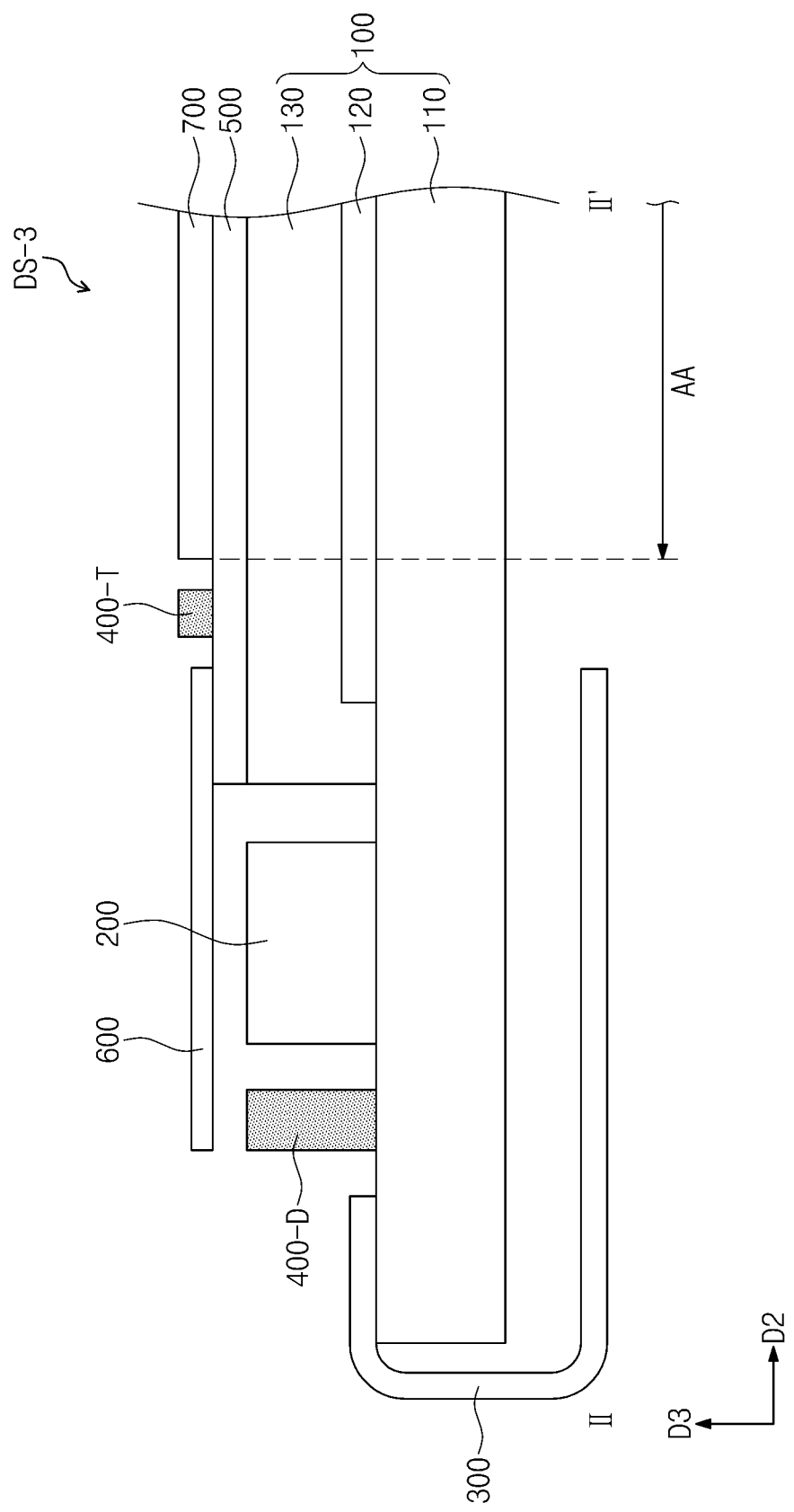
FIG. 9 is a cross-sectional view taken along the line II-II' of FIG. 7.

FIG. 7 is a perspective view of a display device according to an embodiment of the inventive concept, FIG. 8 is a plan view illustrating a portion of components in FIG. 7, and FIG. 9 is a cross-sectional view taken along the line II-II' of FIG. 7. Hereinafter, a display device DS-3 according to an embodiment of the inventive concept will be described with reference to FIGS. 7 to 9.

The display device DS-3 of FIGS. 7 to 9 corresponds to the display device DS of FIG. 1 except for a touch part 500, a touch driving circuit part 600, an optical member 700, and a plurality of partition members 400-D and 400-T. Thus, the same components of the display device DS-3 as those of the display device DS of FIGS. 1 to 5 will be represented with the same reference numerals and symbols, and repeated description may be omitted.

The touch part 500 is on the display panel 100. The touch part 500 may detect a touch signal applied from the outside. The display device DS-3 may further include the touch part 500 to define an active area AA that is capable of detecting the touch signal.

The touch part 500 may include a plurality of conductive patterns TP1, TP2, CP1, and CP2. The conductive patterns TP1, TP2, CP1, and CP2 include a plurality of first touch electrodes TP1, a plurality of first connection electrodes CP1 connecting the first touch electrodes TP1 to each other, a plurality of second touch electrodes TP2 arranged to cross, and to be insulated from, the first touch electrodes TP1, and a plurality of second connection electrodes CP2 connecting the second touch electrodes TP2 to each other. The first and second touch electrodes TP1 and TP2 and the first and second connection electrodes CP1 and CP2 are at the active area AA.

The first touch electrodes TP1 and the first connection electrodes CP1 are connected to each other in the first direction D1, and are arranged in the second direction D2 to form a first touch cell. The first touch cell may detect variation in capacitance in one direction.

The second touch electrodes TP2 and the second connection electrodes CP2 are connected to each other in the second direction D2, and are arranged in the first direction D1 to form a second touch cell. The second touch cell may detect variation in capacitance in a direction crossing the one direction.

Each of a plurality of insulation patterns IP is between a respective one of the first connection electrodes CP1 and a respective one of the second connection electrodes CP2. The insulation patterns IP may electrically insulate the first connection electrodes CP1 from the second connection electrodes CP2.

The second connection electrodes CP2 extend to the outside of the insulation patterns IP, and are connected to the second touch electrodes TP2. However, the second connection electrodes CP may be connected to the second touch electrodes TP2 through through-holes respectively passing through the insulation patterns IP.

The first and second touch electrodes TP1 and TP2 may be at layers different from each other. For example, the first touch electrodes TP1 and the first connection electrodes CP1 may be at the same layer. Also, the second touch electrodes TP2 and the second connection electrodes CP2 may be at the same layer. Here, the insulation patterns IP may be provided in an integrated insulation film connected to each other to allow the first connection electrodes CP1 and the second connection electrodes CP2 to cross each other in an insulated state.

The touch part 500 may further include a plurality of routing lines LW1 and LW2. The routing lines LW1 and LW2 are connected to corresponding electrodes of the first touch electrodes TP1 and the second touch electrodes TP2. Pads PAD-T are defined at an end of each of the routing lines LW1 and LW2. The routing lines LW1 and LW2 may transmit a touch driving signal that is inputted from the outside through the pads PAD-T to the first and second touch electrodes TP1 and TP2.

In the current embodiment, the touch part 500 may be directly disposed on the display panel 100. For example, the conductive patterns TP1, TP2, CP1, and CP2 may be directly patterned on the encapsulating part 130. Or, the touch part 500 may be separately provided and attached onto the display panel 100. For example, the touch part 500 may be provided by patterning the conductive patterns TP1, TP2, CP1, and CP2 on a separate base layer, and by attaching the base layer on the encapsulating part 130. The touch part 500 may be realized by various embodiments, and is not limited to any one embodiment.

The touch driving circuit part 600 is adjacent one side of the touch part 500. The touch driving circuit part 600 is connected to the touch part 500 through the pads PAD-T.

The touch driving circuit part 600 may include lines that connect driving elements to each other. The touch driving signal generated through the driving elements may be transmitted to the touch part 500 through the pads PAD-T to the active area AA.

The optical member 700 is at the touch part 500. The optical member 700 may cover the active area AA. The optical member 700 may be formed of a transparent insulation material so that the touch part 500 is insulated and protected. The optical member 700 may be a functional film capable of improving visibility of the display device DS-3. For example, the optical member 700 may be a polarizing film. The display device DS2 according to the inventive concept may further include the optical member 700 to protect the touch part 500, and to prevent or substantially prevent the display device DS-3 from being deteriorated in visibility due to reflection of external light.

The partition members 400-D and 400-T may include a first partition member 400-D and a second partition member 400-T. The first partition member 400-D and the second partition member 400-T may be at different layers from each other. Here, because the first partition member 400-D is the same as that of FIGS. 1 to 6B, detailed description of the first partition member 400-D may be omitted.

The second partition member 400-T may be formed of the same, or substantially the same, material as that of the first partition member 400-D, and may have the same, or substantially the same, structure as that of the first partition member 400-D. Thus, repeated description of the second partition member 400-T may be omitted.

The second partition member 400-T is disposed on the touch part 500. The second partition member 400-T may be disposed without overlapping the active area AA. The second partition member 400-T is at a space between the optical member 700 and the touch driving circuit part 600 on a plane. Thus, the second partition member 400-T may overlap at least one portion of the routing lines LW1 and LW2.

The second partition member 400-T may prevent, or substantially prevent, an effect of the heat generated from the touch driving circuit part 600 on the optical member 700 in a process for bonding the touch driving circuit part 600.

The process for bonding the touch driving circuit part 600 may be performed in a manner similar to the above-described process for bonding the main circuit part 300. Thus, because the heat generated from the touch driving circuit part 600 may be transferred to the optical member 700, an adhesion force between the optical member 700 and the touch part 500 may weaken, or the optical member 700 may be damaged.

The display device DS-2 according to an embodiment of the inventive concept may further include the second partition member 400-T to block the effect of the heat generated from the touch driving circuit part 600 on the optical member 700. Thus, the display device DS-2 may have improved reliability in the process for bonding the touch driving circuit part 600.

The second partition member 400-T may have various suitable shapes and the second partition member 400-T may protect a side surface of the optical member 700. The second partition member 400-T may have a linear shape extending in the first direction D1. Here, the second partition member 400-T may have a length in the first direction D1, which is greater than at least a width of the area on which the touch driving circuit part 600 is connected to the touch part 500 in the first direction D1.

The second partition member 400-T may have a shape that surrounds a portion of the touch driving circuit part 600 to which the touch part 500 is connected. Alternatively, the second partition member 400-T may have a shape extending along the side surface of the optical member 700. The second partition member 400-T may have various suitable shapes and is not limited to one particular embodiment.

FIGS. 10A to 10D are cross-sectional views illustrating a process for manufacturing the display device according to an embodiment of the inventive concept. In FIGS. 10A to 10D, embodiments corresponding to the display device DS of FIG. 1 is illustrated. Hereinafter, the process for manufacturing the display device DS will be simply described with reference to FIGS. 10A to 10D.

Figure 10A:
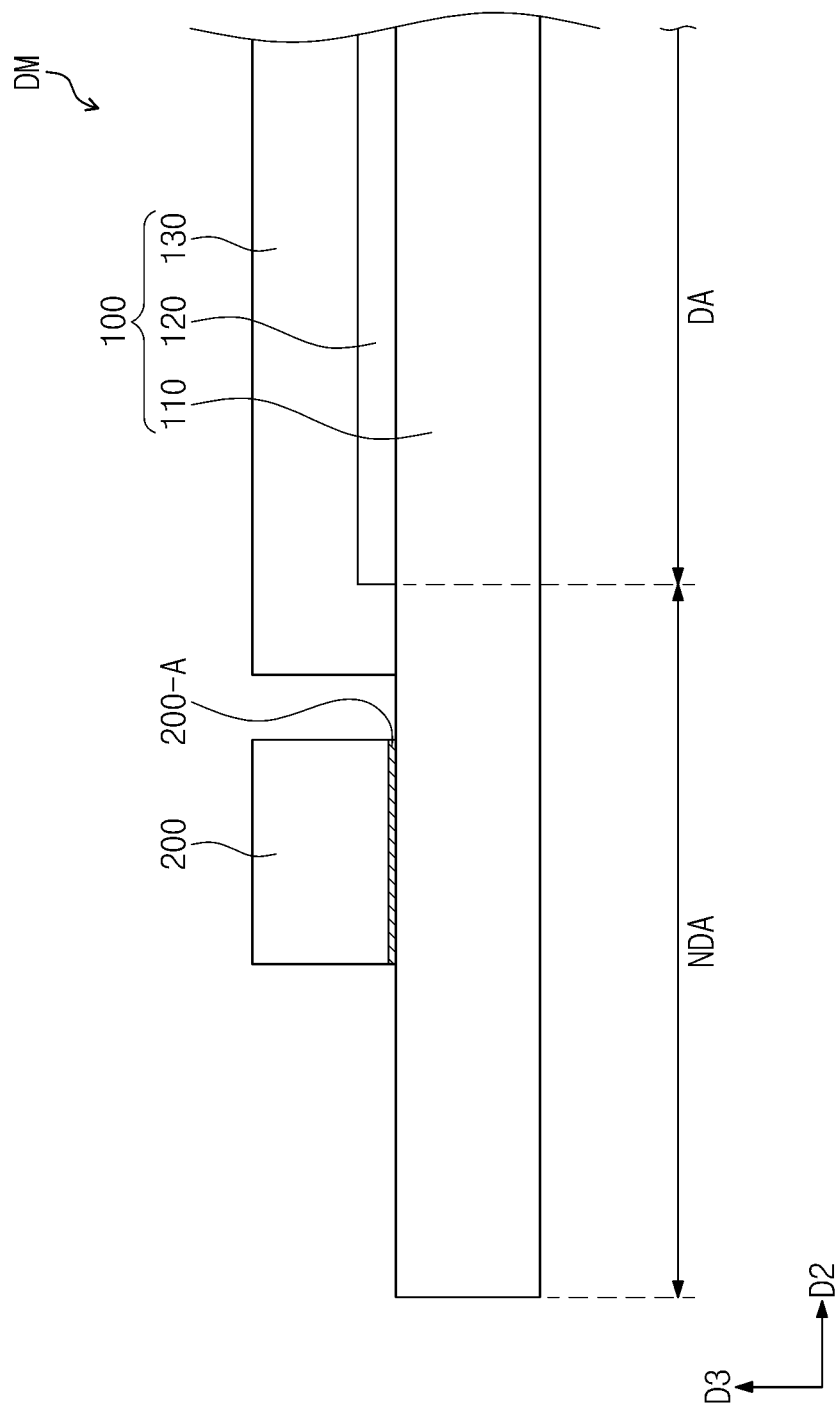
FIGS. 10A to 10D are cross-sectional views illustrating a process for manufacturing the display device according to an embodiment of the inventive concept.

As illustrated in FIG. 10A, a display module DM is provided. The display module DM may be provided by mounting the driving circuit part 200 on the peripheral area NDA of the display panel 100. The driving circuit part 200 is bonded to the array substrate 110 by using a heat or light reactive adhesion member 200-A.

Figure 10B:
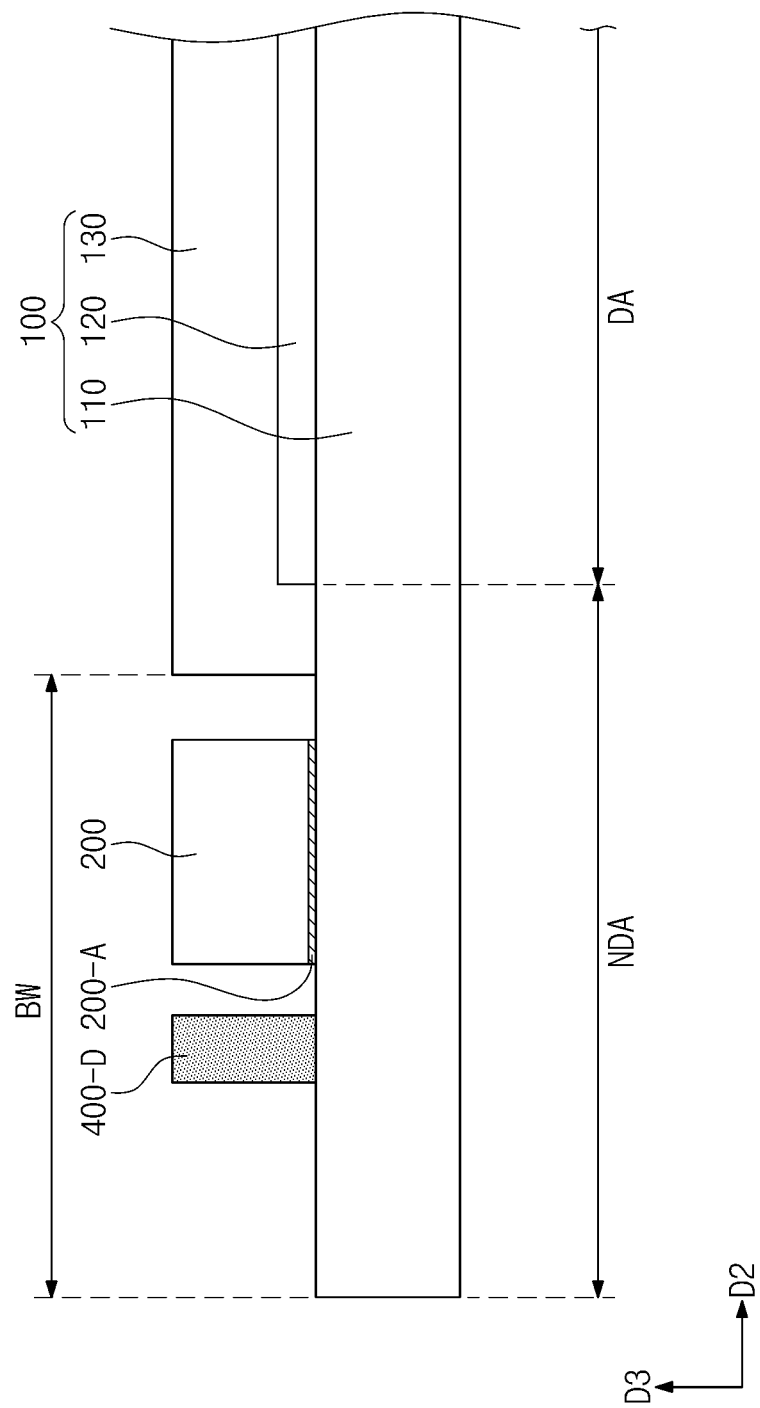

Then, as illustrated in FIG. 10B, the partition member 400-D is formed on the display panel 100. The partition member 400-D may be attached to the array substrate 110 through a separate adhesion member. Alternately, the partition member 400-D may be directly formed on the array substrate 110 through a separate patterning process.

The bezel area is determined by the encapsulating part 130. In FIG. 10B, a bezel width BW measured in the second direction D2 is exemplarily illustrated. The driving circuit part 200 and the main circuit part 300 that will be described later are disposed on the bezel area. In general, the bezel width BW is reduced as the display area DA is expanded. Thus, a distance between the driving circuit part 200 and the main circuit part 300 is reduced.

The partition member 400-D according to the current embodiment may be disposed on the bezel area, and between the driving circuit part 200 and the main circuit part 300. The partition member 400-D may spatially divide the driving circuit part 200 and the main circuit part 300 in a bezel area (e.g., a predetermined bezel area).

Here, a width of the partition member 400-D may be determined according to a distance between the driving circuit part 200 and the main circuit part 300. When the partition member 400-D is formed of a material having low thermal conductivity, the partition member 400-D may contact the side surface of the driving circuit part 200.

The partition member 400-D may have a size less than a height of the driving circuit part 200 or a height at which a top surface of the display panel is disposed to prevent, or substantially prevent other, suitable components from interfering.

Figure 10C:
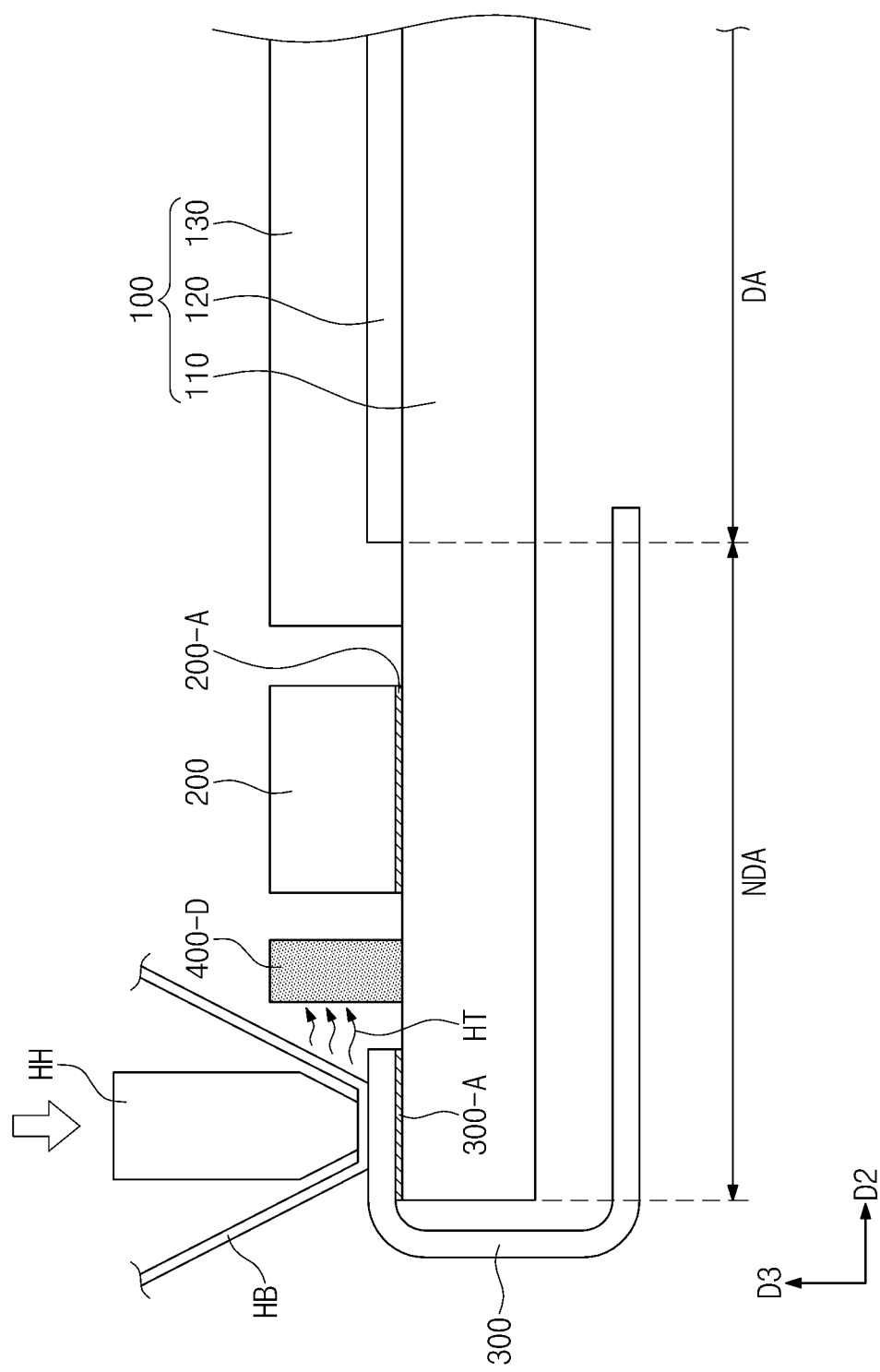
Figure 10D:
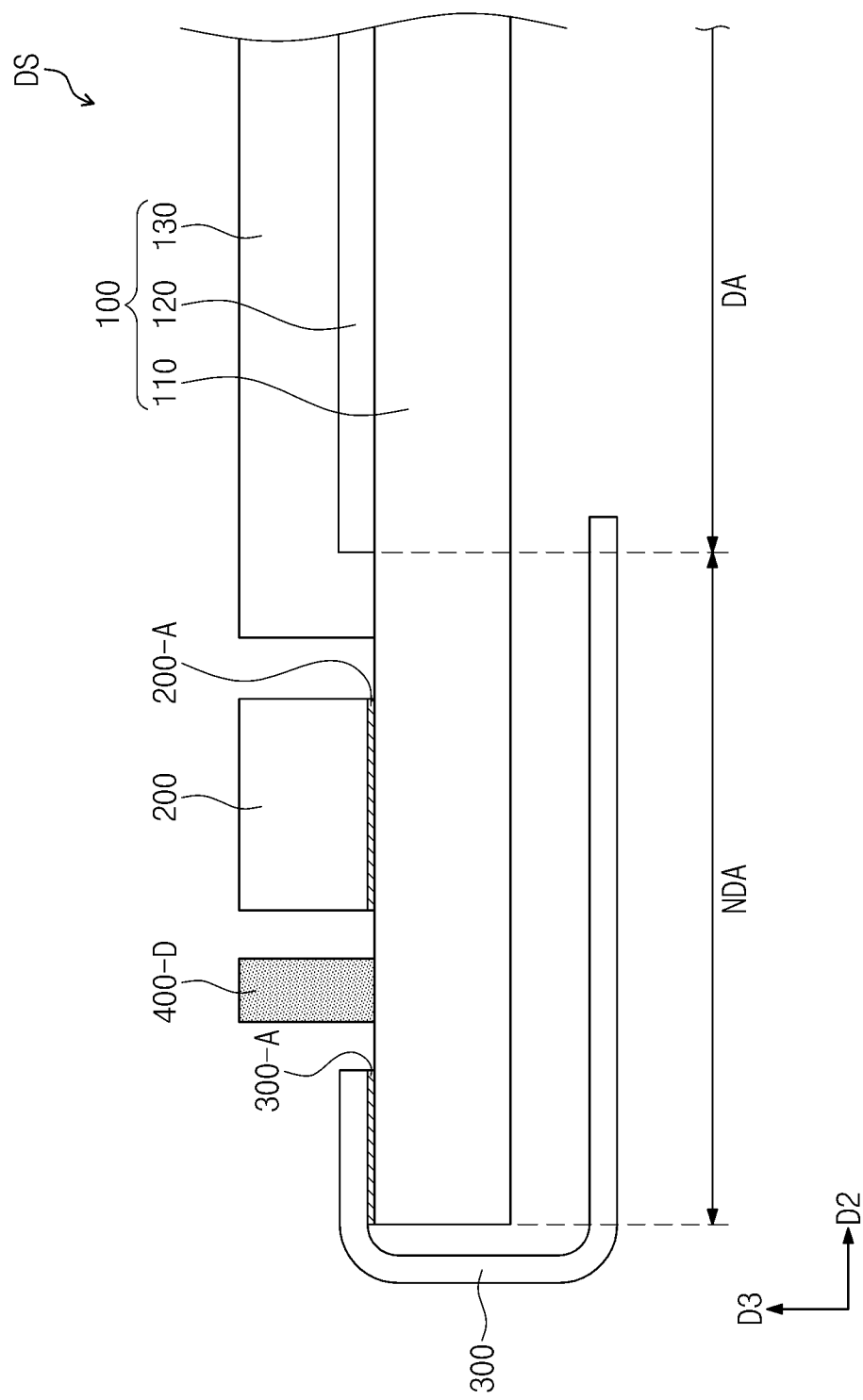

Then, as illustrated in FIGS. 10C and 10D, the main circuit part 300 is connected to the display panel 100. The main circuit part 300 may be bonded onto the array substrate 110 through the heat or light reactive adhesion member.

In detail, at least one portion of the main circuit part 300 is on the array substrate 110. Heat and pressure may be applied to the main circuit part 300 by using a heater HH. An adhesion member 300-A disposed between the main circuit part 300 and the array substrate 110 may react with the heat and the pressure to allow the main circuit part 300 to be coupled to the array substrate 110.

To prevent or substantially prevent the main circuit part 300 from being damaged by the heater HH, a heating prevention member HB (e.g., a predetermined heating prevention member HB) may be provided. The heating prevention member HB may prevent or substantially prevent direct contact between the heater HH and the main circuit part 300.

Here, a portion HT of the heat generated from the heater HH may be dispersed through the air. A portion HT of the heat may be blocked by the partition member 400-D, and may thus not be directly transferred to the driving circuit part 200. Thus, the driving circuit part 200 may have improved reliability in the process for bonding the main circuit part 300.

The display device according to the inventive concept includes the partition member between the driving circuit part and the main circuit part. Thus, during the process for bonding the main circuit part, the heat that is generated from the main circuit part may be prevented or substantially prevented from being transferred to the driving circuit part. The driving circuit part may be stably coupled to the display panel while the main circuit part is bonded.

Also, the display device according to the inventive concept may further include the partition member disposed between the touch driving circuit part and the optical member. Thus, during the process for bonding the touch driving circuit part, the heat that is generated from the touch driving circuit part may be prevented or substantially prevented from being transferred to the optical member. The optical member may be stably coupled to the touch panel without being delaminated or damaged by the heat while the touch driving circuit part is bonded.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A display device comprising:
a display panel comprising an upper surface defined by a display area and a peripheral area adjacent to the display area, and comprising having a plurality of pixels on the display area;
an encapsulating part on the display area;
a driving circuit at the peripheral area, the driving circuit being configured to provide an electrical signal to each of the pixels;
a main circuit at the peripheral area, the main circuit being configured to provide a driving signal to the driving circuit and the display panel, wherein at least one portion of the main circuit is spaced from the driving circuit; and
a first partition member spaced apart and separated from the main circuit and located between the main circuit and the driving circuit,
wherein the first partition member is spaced from the encapsulating part, and
wherein the upper surface of the display panel disposed between the first partition member and the driving circuit is exposed from the first partition member and the driving circuit.

2. The display device of claim 1, wherein the first partition member extends along a side of the driving circuit that faces the main circuit.

3. The display device of claim 2, wherein the first partition member is around at least two sides of the driving circuit or at least two sides of the main circuit.

4. The display device of claim 1, further comprising a first adhesion member comprising a heat reactive or light reactive material between the main circuit and the display panel to attach the main circuit to the display panel.

5. The display device of claim 4, further comprising a second adhesion member comprising a heat reactive or light reactive material between the driving circuit and the display panel to attach the driving circuit to the display panel.

6. The display device of claim 5, wherein the driving circuit comprises an integrated circuit.

7. The display device of claim 1, wherein the display panel further comprises at least one conductive line having one end connected to the driving circuit, and another end at a pad,
wherein the main circuit is connected to the pad, and
wherein the first partition member overlaps the at least one conductive line, and
wherein the first partition member comprises:
an insulator on and contacting the at least one conductive line, and electrically insulated from the conductive line.

8. The display device of claim 1, wherein the first partition member comprises a material having thermal conductivity of about 4 W/m·K or less.

9. The display device of claim 8, wherein the first partition member comprises polymer.

10. A display device comprising:
 a display panel comprising an upper surface defined by a display area and a peripheral area adjacent to the display area, and comprising a plurality of pixels on the display area;
 an encapsulating part covering the pixels,
 a driving circuit disposed on the upper surface and spaced from the encapsulating part and configured to provide an electrical signal to each of the pixels;
 a main circuit disposed on the upper surface and configured to provide a driving signal to the driving circuit and the display panel; and
 a first partition member located between the main circuit and the driving circuit, and spaced apart and separated from the driving circuit and the main circuit, and
 wherein the upper surface of the display panel disposed between the first partition member and the driving circuit is exposed from the first partition member and the driving circuit.

11. A display device comprising:
 a display panel comprising a plurality of pixels;
 an encapsulating part covering the pixels,
 a driving circuit spaced from the encapsulating part and configured to provide an electrical signal to each of the pixels;
 a main circuit configured to provide a driving signal to the driving circuit and the display panel;
 a first partition member located between the main circuit and the driving circuit, and spaced from the driving circuit and the main circuit;
 a touch part on the encapsulating part and comprising a plurality of conductive patterns, each of which is configured to receive an external touch signal;
 a touch driving circuit spaced from the touch part and configured to provide a driving signal to the conductive patterns; and
 a second partition member located between the touch part and the touch driving circuit and spaced from the touch driving circuit.

12. The display device of claim 11, wherein the second partition member is on the encapsulating part.

13. The display device of claim 10, wherein the first partition member overlaps signal lines connecting the driving circuit and the main circuit.

14. The display device of claim 13, wherein the first partition member has a line shape crossing the signal lines.

15. The display device of claim 13, wherein the first partition member comprises a blocking part and an insulator located between the signal lines and the blocking part.

\* \* \* \* \*